United States Patent
Miller et al.

(10) Patent No.: US 11,025,014 B1
(45) Date of Patent: Jun. 1, 2021

(54) SHIELD COMPONENT FOR USE WITH MODULAR ELECTRICAL CONNECTOR TO REDUCE CROSSTALK

(71) Applicant: TE Connectivity Services GmbH, Schaffhausen (CH)

(72) Inventors: Keith Edwin Miller, Manheim, PA (US); Scott Eric Walton, Mount Joy, PA (US)

(73) Assignee: TE CONNECTNITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 16/830,505

(22) Filed: Mar. 26, 2020

(51) Int. Cl.
*H01R 13/648* (2006.01)
*H01R 13/6587* (2011.01)
*H01R 13/6471* (2011.01)
*H01R 13/514* (2006.01)

(52) U.S. Cl.
CPC ....... *H01R 13/6587* (2013.01); *H01R 13/514* (2013.01); *H01R 13/6471* (2013.01)

(58) Field of Classification Search
CPC ............ H01R 13/6587; H01R 13/6585; H01R 13/514; H01R 13/6471
USPC ........................................ 439/607.05–607.13
See application file for complete search history.

(56) References Cited

U.S. PATENT DOCUMENTS

| | | | |
|---|---|---|---|
| 5,066,236 A * | 11/1991 | Broeksteeg | H01R 12/725 439/79 |
| 5,104,341 A * | 4/1992 | Gilissen | H01R 13/6585 439/607.4 |
| 5,702,258 A * | 12/1997 | Provencher | H01R 13/6587 439/79 |
| 6,171,115 B1 | 1/2001 | Mickievicz et al. | |
| 6,267,604 B1 | 7/2001 | Mickievicz et al. | |
| 6,384,341 B1 | 5/2002 | Rothermel et al. | |
| 6,488,549 B1 | 12/2002 | Weller et al. | |
| 6,540,522 B2 | 4/2003 | Sipe | |
| 6,582,250 B2 | 6/2003 | Taylor et al. | |
| 6,655,966 B2 | 12/2003 | Rothermel et al. | |
| 6,663,426 B2 | 12/2003 | Hasircoglu et al. | |
| 6,663,442 B1 | 12/2003 | Helster et al. | |
| 6,676,450 B2 | 1/2004 | Schroll | |
| 6,705,895 B2 | 3/2004 | Hasircoglu | |
| 6,808,399 B2 | 10/2004 | Rothermel et al. | |
| 6,811,414 B1 | 11/2004 | Consoli et al. | |
| 6,811,440 B1 | 11/2004 | Rothermel et al. | |
| 6,824,391 B2 | 11/2004 | Mickievicz et al. | |
| 6,890,214 B2 | 5/2005 | Brown et al. | |

(Continued)

*Primary Examiner* — Khiem M Nguyen

(57) ABSTRACT

A shield member for use in a modular electrical connector. The shield member includes mounting sections and shielding sections. The mounting sections are for mounting to a substrate. The shielding sections have first sections and second sections. The second sections are positioned in a different plane than the first sections. Transition sections extend between the first sections and the second sections. Substrate receiving slots are provided in the first sections and the second sections. Resilient portions are provided on either side of the substrate receiving slots. Contact surfaces extend into the substrate receiving slots. The resilient portions cause a normal force to be applied to the contact surfaces to maintain the contact surfaces in mechanical and electrical engagement with respective ground traces of modules of the modular electrical connector.

20 Claims, 6 Drawing Sheets

(56) References Cited

U.S. PATENT DOCUMENTS

| | | |
|---|---|---|
| 6,932,649 B1 | 8/2005 | Rothermel et al. |
| 6,945,810 B1 | 9/2005 | Morana et al. |
| 6,964,583 B2 | 11/2005 | D'Ambrosia et al. |
| 6,997,736 B2 | 2/2006 | Costello et al. |
| 7,044,794 B2 | 5/2006 | Consoli et al. |
| 7,175,445 B2 | 2/2007 | Consoli et al. |
| 8,840,431 B2 | 9/2014 | Nguyen et al. |
| 10,535,971 B2 | 1/2020 | Annis et al. |

\* cited by examiner though intervening structures may be present. The descriptions of illustrative embodiments according to principles of the present invention is not intended...

SHIELD COMPONENT FOR USE WITH MODULAR ELECTRICAL CONNECTOR TO REDUCE CROSSTALK

FIELD OF THE INVENTION

The present invention relates to a modular connector with reduced crosstalk. In particular, the invention relates to a shield component for use with a modular connector to reduce crosstalk between signal contact pairs.

BACKGROUND OF THE INVENTION

Due to the increasing complexity of electronic components, it is desirable to fit more components in less space on a circuit board or other substrate. Consequently, the spacing between electrical terminals within connectors has been reduced, while the number of electrical terminals housed in the connectors has increased, thereby increasing the need in the electrical arts for electrical connectors that are capable of handling higher and higher speeds and to do so with greater and greater pin densities. It is desirable for such connectors to have not only reasonably constant impedance levels, but also acceptable levels of impedance and cross-talk, as well as other acceptable electrical and mechanical characteristics. Therefore, there remains a need to provide appropriate shielding to preserve signal integrity and to minimize crosstalk as speeds of signals increase and the footprint of the connector remains the same or decreases.

It would, therefore, be beneficial to provide a connector which reduces crosstalk between contact pairs. In particular, it would be beneficial to provide a shield component which reduces crosstalk between contact pairs located proximate a mounting end of the connector.

SUMMARY OF THE INVENTION

An embodiment is directed to a shield member for use in a modular electrical connector. The shield member includes mounting sections and shielding sections. The mounting sections are for mounting to a substrate. The shielding sections have first sections and second sections. The second sections are positioned in a different plane than the first sections. Transition sections extend between the first sections and the second sections. Substrate receiving slots are provided in the first sections and the second sections. Resilient portions are provided on either side of the substrate receiving slots. Contact surfaces extend into the substrate receiving slots. The resilient portions cause a normal force to be applied to the contact surfaces to maintain the contact surfaces in mechanical and electrical engagement with respective ground traces of modules of the modular electrical connector.

An embodiment is directed to a modular electrical connector having a housing and at least one shield member. The housing has modules positioned therein. The housing has a mating end and a mounting end. The mounting end has a mounting interface with at least one shield member receiving slot. The at least one shield member receiving slot extends across adjacent modules. The at least one shield member is positioned in the at least one shield member receiving slot for use in a modular electrical connector. The shield member includes mounting sections and shielding sections. The mounting sections are for mounting to a substrate. The shielding sections have first sections and second sections. The second sections are positioned in a different plane than the first sections. Transition sections extend between the first sections and the second sections. Substrate receiving slots are provided in the first sections and the second sections. Resilient portions are provided on either side of the substrate receiving slots. Contact surfaces extend into the substrate receiving slots. The resilient portions cause a normal force to be applied to the contact surfaces to maintain the contact surfaces in mechanical and electrical engagement with ground traces of the modules of the modular electrical connector.

Other features and advantages of the present invention will be apparent from the following more detailed description of the illustrative embodiment, taken in conjunction with the accompanying drawings which illustrate, by way of example, the principles of the invention.

DETAILED DESCRIPTION OF THE INVENTION

Figure 1:
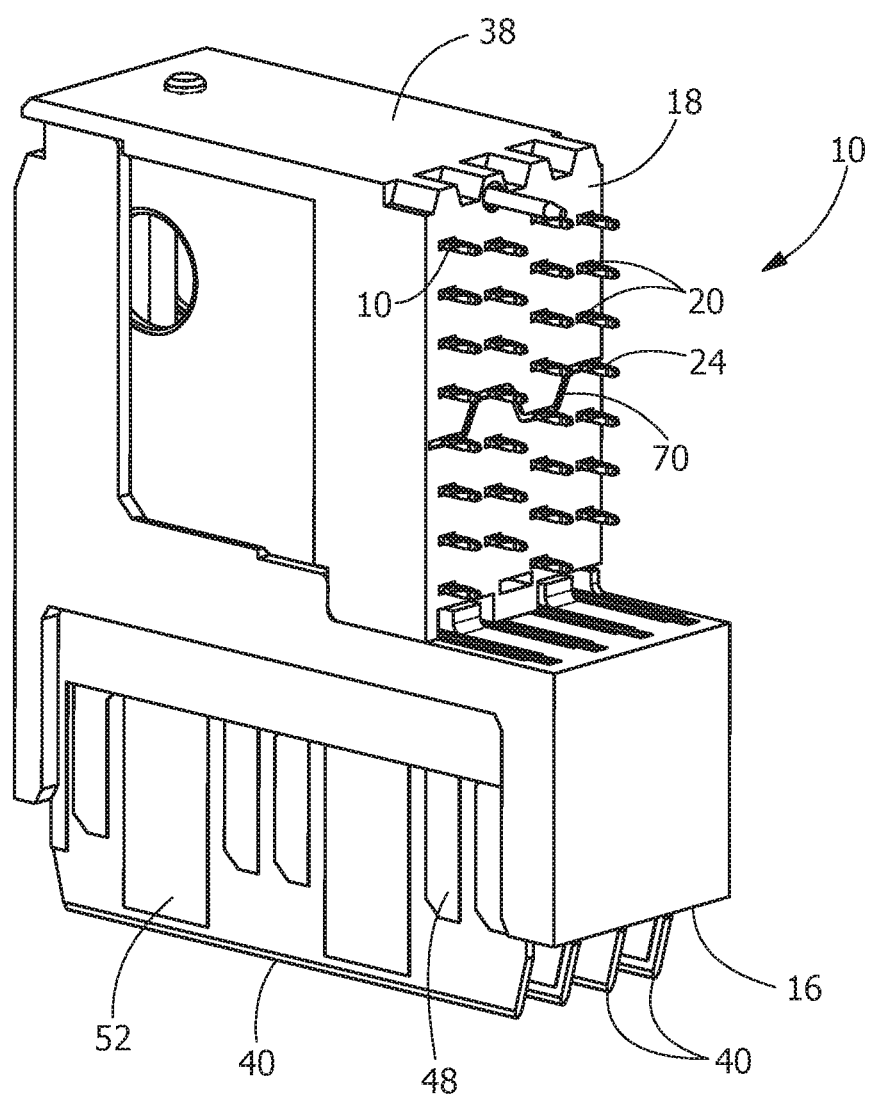
FIG. 1 is a perspective view of an illustrative connector of the present invention, the connector having a plurality of circuit board wafers extending therethrough.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise.

Moreover, the features and benefits of the invention are illustrated by reference to the preferred embodiments. Accordingly, the invention expressly should not be limited to such embodiments illustrating some possible non-limiting combination of features that may exist alone or in other combinations of features, the scope of the invention being defined by the claims appended hereto.

FIG. 1 illustrates an electrical connector 10 formed in accordance with an illustrative embodiment. In the illustrative embodiment, the electrical connector 10 is a daughter-card connector that can be mated to a mating backplane connector (not shown) to electrically connect a backplane circuit board (not shown) and a daughtercard circuit board (not shown). While the electrical connector 10 is described herein with reference a daughtercard connector, it is realized that the subject matter herein may be utilized with different types of electrical connectors other than a daughtercard connector. The daughtercard connector 10 is merely illustrative of an illustrative embodiment of the type of electrical connector 10 that mates with a mating connector.

In the illustrative embodiment shown, the connector 10 constitutes a right angle connector wherein a mating interface or end 16 and mounting interface or end 18 of the connector 10 are oriented perpendicular to one another. The connector 10 is mounted to the daughtercard circuit board (not shown) at the mounting end 18. The connector 10 is mounted to the mating connector (not shown) at the mating end 16. Other orientations of the ends 16, 18 are possible in alternative embodiments. The mounting end 18 has signal contact receiving openings 20 for receiving signal contacts 50 therein. The mounting end 18 has ground contact receiving openings 22 for receiving ground contacts 54 therein. The mounting end 18 has at least one ground or shield plate or member receiving slot 24 for ground plates or members therein.

Figure 5:
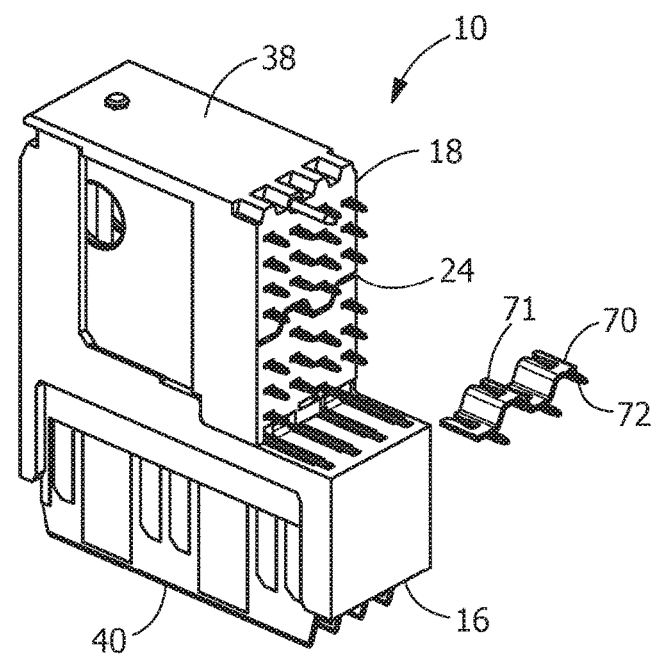
FIG. 5 is a perspective view of the connector of FIG. 1 with a shield member exploded therefrom.

As shown in the illustrative embodiment shown in FIGS. 1 and 5, the connector 10 includes a housing 38 which positions a plurality of printed circuit board modules 40. The modules 40 may be printed circuit boards. The housing 38 may be made from one or more components. Each of the modules 40 has a mating end 42 configured to mate with the mating connector. Each of the modules 40 has a mounting end 46 which is mounted to the daughtercard circuit board (not shown).

Figure 2:
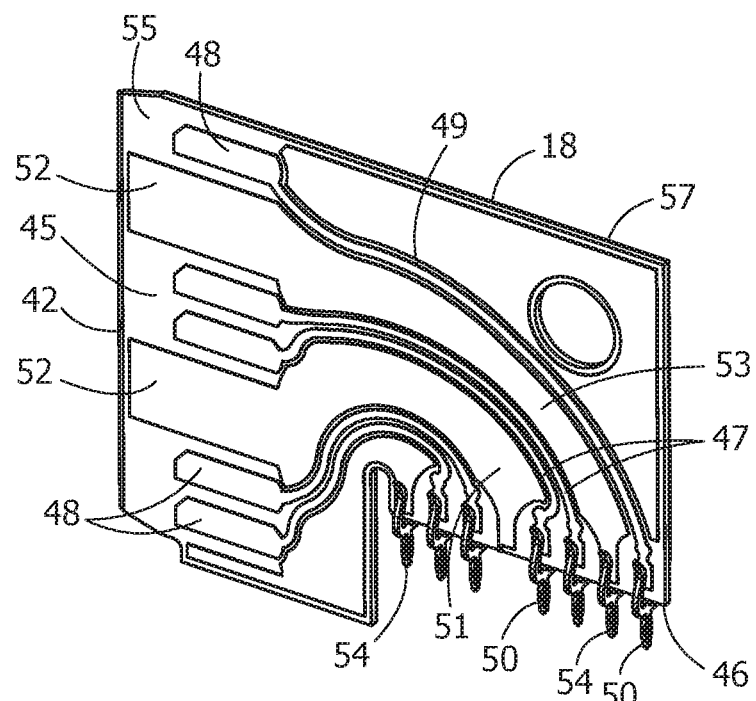
FIG. 2 is a front perspective view of one of the circuit board wafers of the connector of FIG. 1.

As shown in FIG. 2, each of the modules 40 has a circuit board or substrate 45 which holds a plurality of individual signal pathways 47 which include mating signal contact pads 48, signal traces 49 and mounting signal contacts 50. The mating signal contact pads 48 are mechanically and electrically connected to the signal traces 49 by known methods. The mounting signal contacts 50 are mechanically and electrically connected to the signal traces 49 by known methods, such as but not limited to soldering, as will be more fully described. The signal pathways 47 extend from proximate the mating end 42 to proximate the mounting end 46. In an exemplary embodiment, the signal pathways 47 are arranged in pairs carrying differential signals. The individual signal pathways 47 are positioned on a first surface 55 of the substrates 45.

Each of the substrates 45 of the modules 40 holds a plurality of ground pathways 51 which include mating ground contact pads 52, ground traces 53 and mounting ground contacts 54. The mating ground contact pads 52 are mechanically and electrically connected to the ground traces 53 by known methods. The mounting ground contacts 54 are mechanically and electrically connected to the ground traces 53 by known methods, such as but not limited to soldering to a conductive pad of the ground traces 53. The ground pathways 51 extend from proximate the mating end 42 to proximate the mounting end 46. The individual ground pathways 51 are positioned on the first surface 55 of each of the substrates 45.

Figure 3:
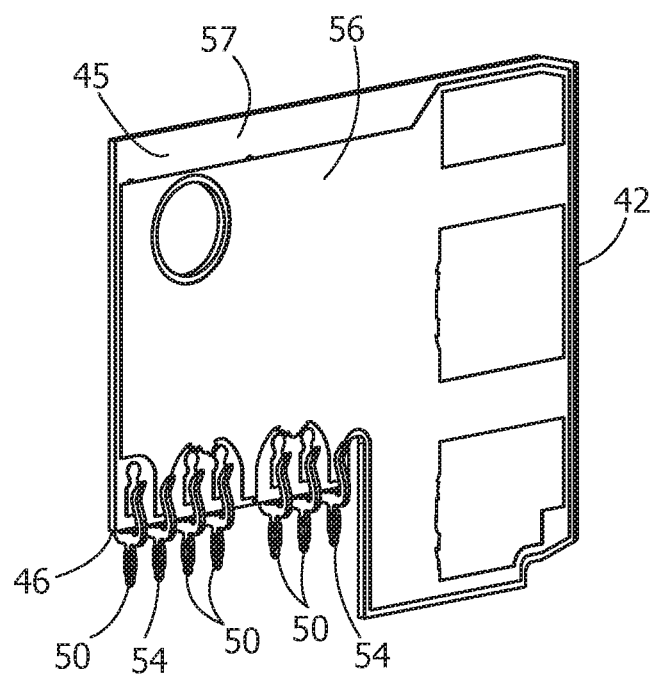
FIG. 3 is a back perspective view of one of the circuit board wafers of the connector of FIG. 1.
Figure 4:
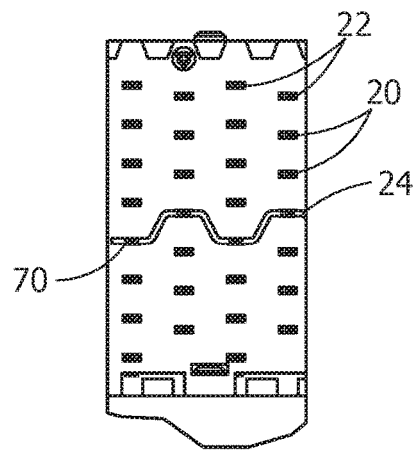
FIG. 4 is a plan view of a circuit board mounting face of the connector of FIG. 1. perspective view of the printed circuit board connector of the present invention.

As shown in FIG. 3, each of the substrates 45 of the modules 40 include ground traces 56 on a second surface 57 of each substrate 45. The second surface 57 being opposed and spaced from the first surface 55. The ground traces 56 extend from proximate the mating end 42 to the mounting end 46.

Figure 7:
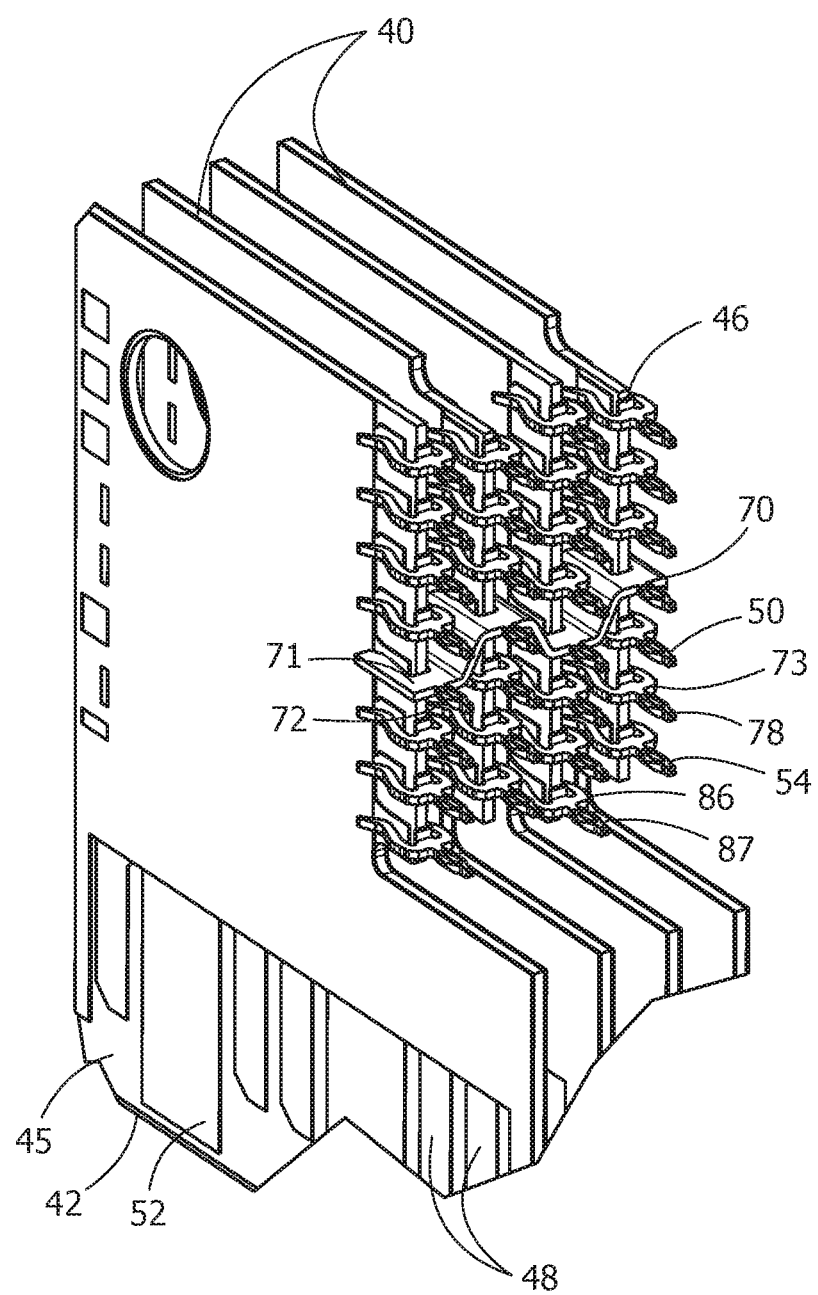
FIG. 7 is a perspective view of the connector with the housing removed.
Figure 8:
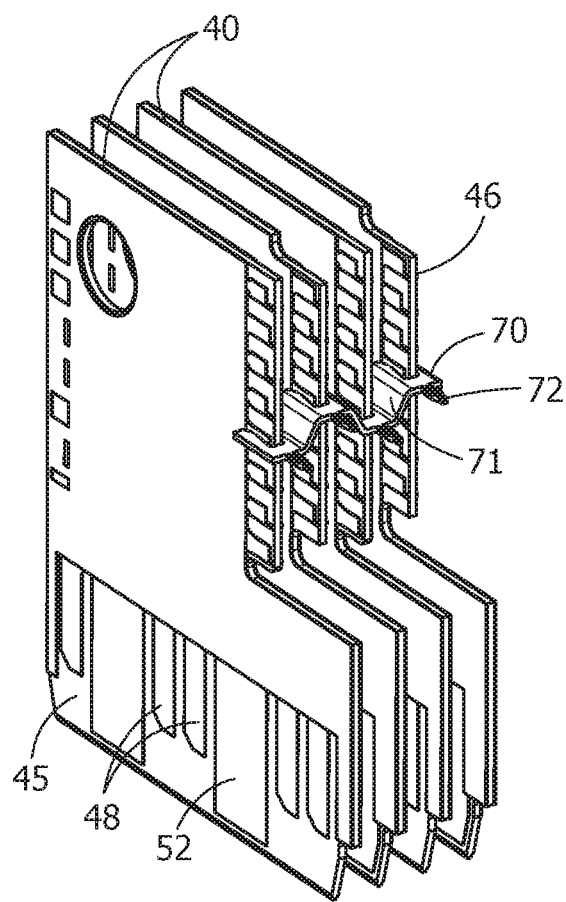
FIG. 8 is a perspective view of the connector with the housing, the receiving signal contacts and the receiving ground contacts removed to illustrate the interaction of the shield component with the circuit board wafers.

As shown in FIG. 7, the mounting signal contacts 50 have signal trace engaging members 73 and compliant portions 78. The signal trace engaging members 73 of the mounting signal contacts 50 are mechanically and electrically mounted and connected to the signal traces 49 of the substrate 45 by known methods, such as but not limited to soldering. The compliant portions 78 are configured to engage the daughtercard (not shown). The compliant portions 78 may be, but are not limited to, an eye of the needle pin, although other configurations may be used.

The mounting ground contacts 54 have ground trace engaging members 86 and compliant portions 87. The ground trace engaging members 86 of the mounting ground contacts 54 are mechanically and electrically mounted and connected to the ground traces 53 and the ground traces 56 of the substrate 45 by known methods, such as but not limited to soldering. The compliant portions 87 are configured to engage the daughtercard (not shown). The compliant portions 87 may be, but are not limited to, an eye of the needle pin, although other configurations may be used.

The combination of the ground pathways 51 and the ground traces 56 surround the pairs of signal pathways 47. As the ground pathways 51 and the ground traces 56 are electrically commoned together, the ground pathways 51 and the ground traces 56 provide electrical shielding and reduce crosstalk between the pairs of signal pathways 47.

Figure 10:
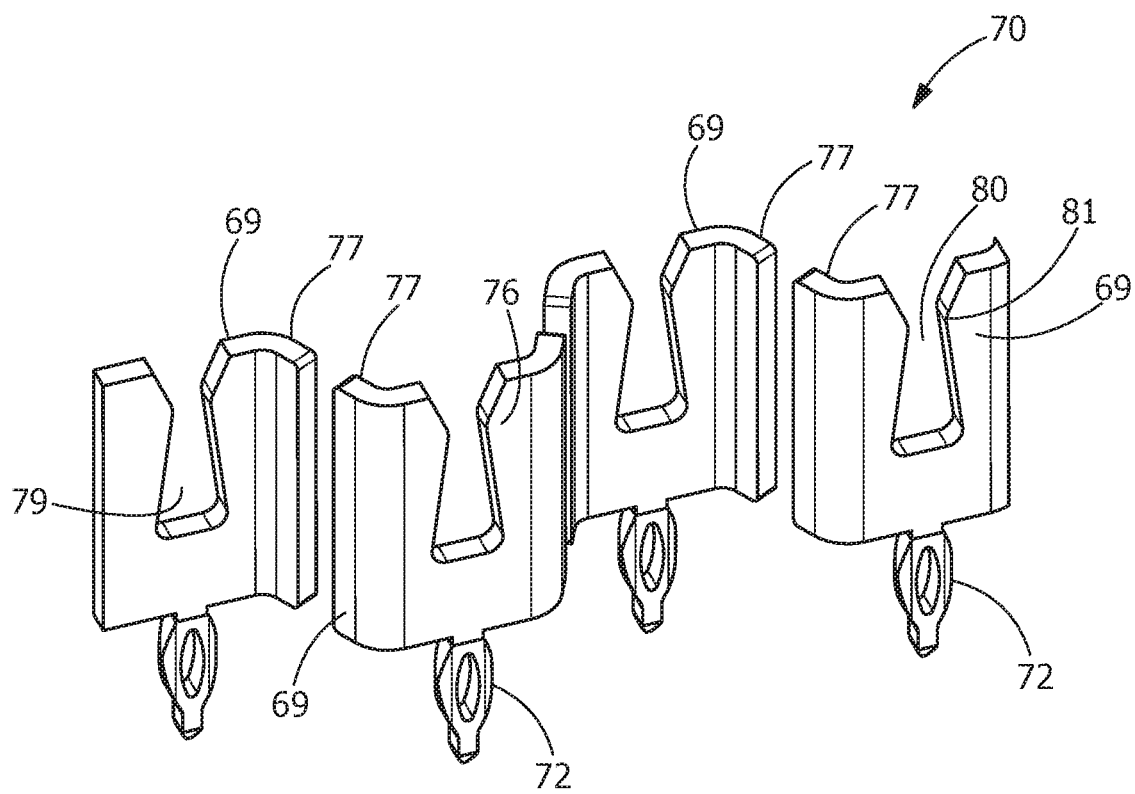
FIG. 10 is a perspective view of an alternate embodiment of the shield member.

As shown in FIGS. 5 and 7, a shield or ground member or plate 70 extends across the substrates 45 and the modules 40. Although only one shield or ground plate 70 is shown, in other embodiments multiple shield or ground plates 70 may be provided. For example, as shown in FIG. 10, the ground member or plate 70 may be configured to have individual segments 69.

As shown in FIGS. 5 through 9, the shield or ground plate 70 has shielding sections 71 and mounting sections 72. The shield or ground plate 70 is non-planar. The mounting sections 72 have compliant portions 74, such as an eye of the needle pin, although other configurations may be used. The shielding sections 71 of the shield or ground plates 70 have an accordion or zig-zag configuration to pass between and along pairs of mounting signal contacts 50. Optionally, the shielding sections 71 may be located as far from the mounting signal contacts 50 as possible. For example, the shielding sections 71 may be shaped to be positioned generally equidistant from adjacent mounting signal contacts 50.

Figure 6:
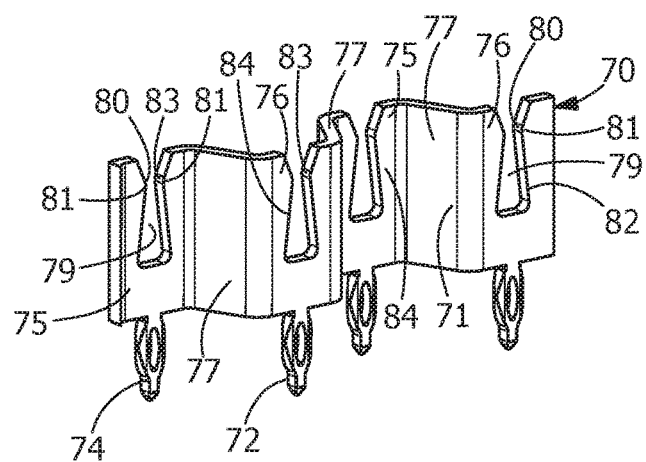
FIG. 6 is a perspective view of the shield member of FIG. 5.
Figure 9:
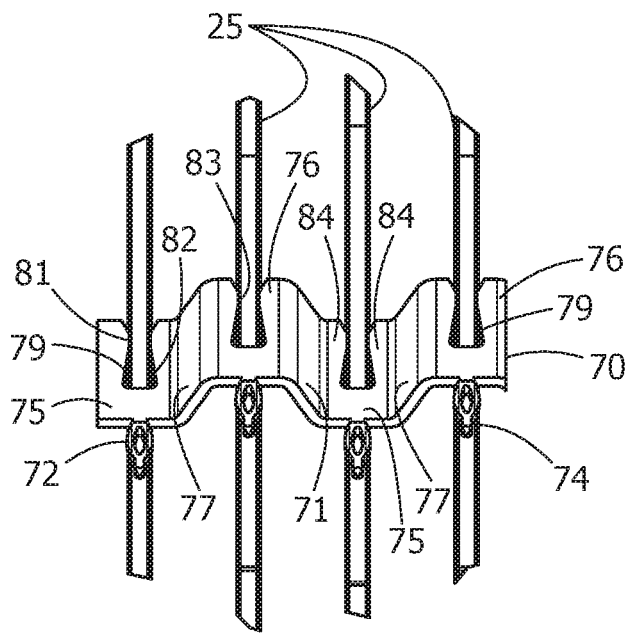
FIG. 9 is an enlarged perspective view of the shield component in engagement with the circuit board wafers.

As shown in FIGS. 6 and 9, the shielding sections 71 have first sections 75 and second sections 76 which are positioned in a different plane than the first sections 75. Transition sections 77 extend between the first sections 75 and the second sections 76. substrate receiving slots 79 are provided in the first sections 75 and the second sections 76. In the illustrative embodiment, the transition sections 77 are angled with respect to the first sections 75 and the second sections 76. Alternatively, the transition sections 77 may curved or radiused rather than angled.

Each of the substrate receiving slots 79 has a reduced or narrow section 80 with projections 81 which extend into the slots 79 from the sidewalls 82. The projections 81 have contact surfaces 83 provided thereon. Resilient arms or portions 84 are provided on either side of the substrate receiving slots 79.

In the illustrative embodiment shown in FIG. 1, the housing 38 of the connector 10 has four modules 40 which are positioned adjacent to each other. Each module 40 is spaced from adjacent modules 40 to provide mating slots 62 for receiving portions of the mating connector. As shown in FIG. 2, the ground plate receiving slot 24 of the mounting end 18 of the housing 38 extends across the four modules 40.

With the modules 40 properly positioned in the housing 38, the shield or ground plate 70 is positioned in the ground plate receiving slot 24. Alternatively, the shield or ground plate 70 is positioned in the ground plate receiving slot 24 the shield or ground plate 70 may be positioned in the ground plate receiving slot 24 prior to the positioning of the modules 40 in the housing.

When properly assembled, the mounting ends 46 of the substrates 45 of the modules 40 are positioned in the substrate receiving slots 79 of the shield or ground plate 70. In this position, the contact surfaces 83 of the projections 81 engage respective ground traces 53 and ground traces 56 to place the shield or ground plate 70 in mechanical and electrical engagement with the respective ground traces 53 and ground traces 56. The transition sections 77 of the zig-zag configuration of the shield or ground plate 70 which extend between the first sections 75 and the second sections 76 allow for the first sections 75 and the second sections 76 to have movement relative to each other. This allows the shield or ground plate 70 to be compliant to compensate for slight misalignments of the substrates 45. In addition, the resilient arms or portions 84 cause a normal force to be applied to the contact surfaces 83 of the projections 81 of the substrate receiving slots 79 to maintain the contact surfaces 83 in mechanical and electrical engagement with the respective ground traces 53 and ground traces 56.

With the housing 38 properly assembled, the ground pathways 51 and the ground traces 56 of adjacent modules 40 extend about the periphery of the pairs of signal pathways 47 and surround the pairs of signal pathways 47 to provide electrical shielding for the pairs of signal pathways 47. In an exemplary embodiment, entire, 360 degree shielding is provided by the ground pathways 51 and the ground traces 56 along the length of the signal pathways 47. The ground pathways 51 and the ground traces 56 may control electrical characteristics at the mating ends and throughout the housing 38, such as by controlling cross talk, signal radiation or other electrical characteristics.

The addition of the shield or ground plate 70 reduces the cross talk between signal pairs, particularly in the area between the mounting end 46 of the housing 38 and the circuit board on which the connector 10 is mounted. The shield or ground plate 70 also provides a redundant contact design that interconnects the substrates 45 within the connector 10. The accordion configuration of the shield or ground plate 70 provides compliance to maintain the proper normal force between the contact surfaces 83 of the projections 81 of the substrate receiving slots 79 and the respective ground traces 53 and ground traces 56 of the substrates 45.

While the invention has been described with reference to a preferred embodiment, it will be understood by those skilled in the art that various changes may be made and equivalents may be substituted for elements thereof without departing from the spirit and scope of the invention as defined in the accompanying claims. One skilled in the art will appreciate that the invention may be used with many modifications of structure, arrangement, proportions, sizes, materials and components and otherwise used in the practice of the invention, which are particularly adapted to specific environments and operative requirements without departing from the principles of the present invention. The presently disclosed embodiments are therefore to be considered in all respects as illustrative and not restrictive, the scope of the invention being defined by the appended claims, and not limited to the foregoing description or embodiments.

The invention claimed is:

1. A shield member for use in a modular electrical connector, the shield member comprising:
   mounting sections for mounting to a substrate;
   shielding sections having first sections and second sections, the second sections being positioned in a different plane than the first sections, transition sections extend between the first sections and the second sections;
   substrate receiving slots provided in the first sections and the second sections, resilient portions are provided on either side of the substrate receiving slots, contact surfaces extend into the substrate receiving slots;
   wherein the resilient portions cause a normal force to be applied to the contact surfaces to maintain the contact surfaces in mechanical and electrical engagement with respective ground traces of modules of the modular electrical connector.

2. The shield member as recited in claim 1, wherein the substrate receiving slots have reduced sections with projections which extend into the slots from sidewalls of the slots.

3. The shield member as recited in claim 2, wherein the projections have the contact surfaces provided thereon.

4. The shield member as recited in claim 3, wherein the mounting sections have compliant portions.

5. The shield member as recited in claim 3, wherein the shielding sections of have an accordion or zig-zag configuration.

6. The shield member as recited in claim 3, wherein the transition sections are angled with respect to the first sections and the second sections.

7. The shield member as recited in claim 3, wherein the transition sections are curved or radiused.

8. A modular electrical connector comprising:
   a housing having modules positioned therein, the housing having a mating end and a mounting end, the mounting end having a mounting interface with at least one shield member receiving slot, the at least one shield member receiving slot extending across adjacent modules;
   at least one shield member positioned in the at least one shield member receiving slot for use in a modular electrical connector, the shield member comprising:
   mounting sections for mounting to a substrate;
   shielding sections having first sections and second sections, the second sections being positioned in a different plane than the first sections, transition sections extend between the first sections and the second sections;
   substrate receiving slots provided in the first sections and the second sections, resilient portions are provided on either side of the substrate receiving slots, contact surfaces extend into the substrate receiving slots;
   wherein the resilient portions cause a normal force to be applied to the contact surfaces to maintain the contact surfaces in mechanical and electrical engagement with ground traces of the modules of the modular electrical connector.

9. The modular electrical connector as recited in claim 8, wherein the substrate receiving slots have reduced sections with projections which extend into the slots from sidewalls of the slots.

10. The modular electrical connector as recited in claim 9, wherein the projections have the contact surfaces provided thereon.

11. The modular electrical connector as recited in claim 10, wherein the shielding sections of have an accordion or zig-zag configuration.

12. The modular electrical connector as recited in claim 10, wherein the mounting sections have compliant portions.

13. The modular electrical connector as recited in claim 10, wherein the transition sections are angled with respect to the first sections and the second sections.

14. The modular electrical connector as recited in claim 10, wherein the transition sections are curved or radiused.

15. The modular electrical connector as recited in claim 10, wherein the modular electrical connector is a right angle connector wherein the mating end the mounting end are oriented perpendicular to one another.

16. The modular electrical connector as recited in claim 10, wherein the mounting interface has signal contact receiving openings for receiving signal contacts therein and ground contact receiving openings for receiving ground contacts therein.

17. The modular electrical connector as recited in claim 16, wherein the modules have substrates which hold a plurality of individual signal pathways, the signal pathways include signal contact pads, signal traces and signal contacts, the signal contact pads are mechanically and electrically connected to the signal traces, the signal contacts are mechanically and electrically connected to the signal traces, the signal pathways extend from proximate the mating end to proximate the mounting end, the signal pathways are arranged in pairs carrying differential signals, the signal pathways are positioned on a first surface of the substrates.

18. The modular electrical connector as recited in claim 17, wherein the substrates have ground pathways which include ground contact pads, ground traces and ground contacts, the mating ground contact pads are mechanically and electrically connected to the ground traces, the ground contacts 5 are mechanically and electrically connected to the ground traces, the ground pathways extend from proximate the mating end to proximate the mounting end, the ground pathways are positioned on the first surface of each substrate.

19. The modular electrical connector as recited in claim 18, wherein the substrates include ground traces on second surfaces of each the substrates, the second surface are opposed and spaced from the first surfaces, the ground traces on the second surfaces extend from proximate the mating end to the mounting end.

20. The modular electrical connector as recited in claim 19, wherein the accordion or zig-zag configuration of the shielding sections of the at least one shield member pass between and along pairs of the signal contacts, wherein the at least one shield member reduces the cross talk between the pairs of the signal contacts in the area between the mounting end of the substrate on which the modular electrical connector is mounted.

\* \* \* \* \*